United States Patent
Shen et al.

(10) Patent No.: US 11,830,786 B2
(45) Date of Patent: Nov. 28, 2023

(54) SEMICONDUCTOR PACKAGE AND METHOD FOR MANUFACTURING THE SAME

(71) Applicant: Innoscience (Suzhou) Technology Co., Ltd., Suzhou (CN)

(72) Inventors: Jingyu Shen, Suzhou (CN); Qiyue Zhao, Suzhou (CN); Chunhua Zhou, Suzhou (CN); Chao Yang, Suzhou (CN); Weigang Yao, Suzhou (CN); Baoli Wei, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 410 days.

(21) Appl. No.: 17/259,938

(22) PCT Filed: Dec. 28, 2020

(86) PCT No.: PCT/CN2020/140307
§ 371 (c)(1),
(2) Date: Jan. 13, 2021

(87) PCT Pub. No.: WO2022/140958
PCT Pub. Date: Jul. 7, 2022

(65) Prior Publication Data
US 2022/0375815 A1    Nov. 24, 2022

(51) Int. Cl.
*H01L 23/367* (2006.01)
*H01L 21/56* (2006.01)
(Continued)

(52) U.S. Cl.
CPC ........ *H01L 23/3677* (2013.01); *H01L 21/563* (2013.01); *H01L 23/3107* (2013.01); *H01L 23/49827* (2013.01)

(58) Field of Classification Search
CPC .............. H01L 23/3677; H01L 21/563; H01L 23/3107; H01L 23/49827
See application file for complete search history.

(56) References Cited

U.S. PATENT DOCUMENTS 5,041,902 A * 8/1991 McShane .............. H01L 23/367
257/E23.047
5,175,612 A * 12/1992 Long ...................... H05K 3/303
257/667
(Continued)

FOREIGN PATENT DOCUMENTS

CN       1757119 B       2/2011
CN     205609497 U       9/2016
(Continued)

OTHER PUBLICATIONS

International Search Report and Written Opinion of the corresponding PCT application No. PCT/CN2020/140307 dated May 27, 2021.

*Primary Examiner* — Nathan W Ha
(74) *Attorney, Agent, or Firm* — McCoy Russell LLP

(57) ABSTRACT

A flip-chip semiconductor package with improved heat dissipation capability and low package profile is provided. The package comprises a heat sink having a plurality of heat dissipation fins and a plurality of heat dissipation leads. The heat dissipation leads are connected to a plurality of thermally conductive vias of a substrate so as to provide thermal conductivity path from the heatsink to the substrate as well as support the heatsink to relieve compressive stress applied to a semiconductor die by the heatsink. The package further comprises an encapsulation layer configured to cover the heat dissipation leads of the heat sink and expose the heat dissipation fins of the heat sink.

20 Claims, 15 Drawing Sheets

(51) Int. Cl.
*H01L 23/31* (2006.01)
*H01L 23/498* (2006.01)

(56) References Cited

U.S. PATENT DOCUMENTS

| | | | | |
|---|---|---|---|---|
| 5,227,663 | A * | 7/1993 | Patil | H05K 3/303 |
| | | | | 257/796 |
| 5,821,692 | A * | 10/1998 | Rogers | H10K 50/844 |
| | | | | 313/506 |
| 5,880,524 | A * | 3/1999 | Xie | H01L 23/433 |
| | | | | 257/E23.09 |
| 5,907,189 | A * | 5/1999 | Mertol | H01L 23/367 |
| | | | | 257/796 |
| 6,429,513 | B1 * | 8/2002 | Shermer, IV | H01L 23/427 |
| | | | | 257/E23.092 |
| 6,562,655 | B1 * | 5/2003 | Glenn | H01L 23/4334 |
| | | | | 257/E23.092 |
| 6,580,167 | B1 * | 6/2003 | Glenn | H01L 23/4334 |
| | | | | 257/713 |
| 9,736,966 | B1 * | 8/2017 | Anderl | H01L 21/4882 |
| 10,510,713 | B1 | 12/2019 | Chen et al. | |
| 10,586,751 | B2 | 3/2020 | Huang | |
| 2003/0057545 | A1 * | 3/2003 | Shim | H01L 23/4334 |
| | | | | 257/E23.079 |
| 2003/0179549 | A1 | 9/2003 | Zhong et al. | |
| 2005/0034841 | A1 | 2/2005 | Barr et al. | |
| 2005/0274487 | A1 * | 12/2005 | Goth | F28F 9/001 |
| | | | | 257/E23.088 |
| 2005/0277280 | A1 * | 12/2005 | Brunschwiler | H01L 23/3677 |
| | | | | 257/E23.105 |
| 2006/0113663 | A1 * | 6/2006 | Yuan | H01L 23/4334 |
| | | | | 257/E23.092 |
| 2007/0069369 | A1 * | 3/2007 | Hou | H01L 23/36 |
| | | | | 257/E23.101 |
| 2007/0108587 | A1 * | 5/2007 | Lee | H01L 23/4334 |
| | | | | 257/691 |
| 2008/0218975 | A1 * | 9/2008 | Mitsui | H01L 23/4006 |
| | | | | 361/709 |
| 2009/0115037 | A1 * | 5/2009 | How | H01L 23/49548 |
| | | | | 438/122 |
| 2009/0116194 | A1 * | 5/2009 | Matsushiba | H01L 23/13 |
| | | | | 361/709 |
| 2009/0161300 | A1 * | 6/2009 | Chou | H05K 7/20363 |
| | | | | 361/689 |
| 2010/0019379 | A1 * | 1/2010 | Zhao | H01L 23/3675 |
| | | | | 257/E21.705 |
| 2010/0028102 | A1 * | 2/2010 | Mitsui | H01L 23/4006 |
| | | | | 411/383 |
| 2011/0001225 | A1 | 1/2011 | Ohtani | |
| 2011/0304039 | A1 * | 12/2011 | Miyamoto | H01L 23/473 |
| | | | | 257/E23.08 |
| 2012/0104591 | A1 * | 5/2012 | Warren | H01L 23/4334 |
| | | | | 438/122 |
| 2012/0287582 | A1 * | 11/2012 | Vinciarelli | H05K 1/111 |
| | | | | 361/728 |
| 2013/0083488 | A1 * | 4/2013 | Watanabe | H01L 23/4006 |
| | | | | 257/E23.083 |
| 2013/0215613 | A1 * | 8/2013 | Wu | F21K 9/20 |
| | | | | 362/249.02 |
| 2013/0314877 | A1 * | 11/2013 | Watanabe | H01L 23/562 |
| | | | | 257/687 |
| 2014/0015106 | A1 * | 1/2014 | Hsieh | H01L 23/427 |
| | | | | 257/618 |
| 2014/0239488 | A1 * | 8/2014 | Kobayashi | H01L 23/367 |
| | | | | 257/718 |
| 2014/0355218 | A1 * | 12/2014 | Vinciarelli | H05K 5/065 |
| | | | | 361/728 |
| 2014/0374913 | A1 * | 12/2014 | Otremba | H01L 23/3675 |
| | | | | 257/773 |
| 2015/0162312 | A1 * | 6/2015 | Shimizu | H01L 23/3675 |
| | | | | 228/199 |
| 2016/0064355 | A1 * | 3/2016 | Pan | H01L 23/04 |
| | | | | 438/107 |
| 2017/0231113 | A1 * | 8/2017 | Anderl | G06F 1/20 |
| 2019/0006269 | A1 * | 1/2019 | Xu | H01L 21/4825 |
| 2020/0035614 | A1 * | 1/2020 | Lin | H01L 21/568 |
| 2020/0067377 | A1 * | 2/2020 | Buckmueller | H01R 13/6633 |
| 2021/0195798 | A1 * | 6/2021 | Neal | H01L 23/3675 |
| 2022/0369498 | A1 * | 11/2022 | Kim | H01L 23/4275 |

FOREIGN PATENT DOCUMENTS

| | | |
|---|---|---|
| CN | 106486383 A | 3/2017 |
| WO | 2017109878 A1 | 6/2017 |

* cited by examiner

SEMICONDUCTOR PACKAGE AND METHOD FOR MANUFACTURING THE SAME

FIELD OF THE INVENTION

The present invention generally relates to heat dissipation technology for semiconductor packages. More specifically, the present invention relates to a heatsink incorporated in a flip-chip land grid array package.

BACKGROUND OF THE INVENTION

Gallium nitride (GaN) based semiconductors have been widely applied to high frequency and high power electronic devices due to their excellent material properties. Flip chip (FC) land grid array (LGA) package has been one of the common packages for GaN based devices due to the enabled large pin count, negligible parasitic inductance in the chip-to-package interconnect path as well as reduced package size. In conventional flip-chip packages, heat is transferred from the IC through the substrate to the ambient. The device junction temperature needs to be maintained below the maximum junction temperature of the device to minimize degradation in the transport properties of the semiconductor and, more importantly, to assure good reliability. With the increase in device functionalities and power consumption, the high power densities available in GaN based devices create new challenges for heat management on these devices. Most GaN transistors are grown on SiC substrates, which can be between 1.5 and 3 times more thermally conductive than Si. However, SiC substrates are many times more expensive than Si, and are still severely limit by heat dissipation. Therefore, there is a demand for a FC-LGA package having higher heat dissipating capability.

SUMMARY OF THE INVENTION

In accordance with one aspect of the subject application, a semiconductor package is provided. The semiconductor package comprising: a substrate having a first substrate surface, a second substrate surface opposite to the first substrate surface; an insulative core layer arranged between the first and second substrate surfaces and a plurality of thermally conductive vias extending from the first substrate surface to the second substrate surface through the core layer; a semiconductor die having an active surface and a passive surface opposite to the active surface; and being flipped and attached on the substrate such that the active surface is facing the substrate; a heat sink having a base comprising a first base surface and a second base surface opposite to the first base surface; a plurality of heat dissipation fins upstanding on the first base surface; and a plurality of heat dissipation leads connecting to the base; an encapsulation layer formed on the substrate and configured for encapsulating the semiconductor die; wherein: the heatsink is mounted on the semiconductor die such that the second base surface of the heatsink is attached and thermally coupled to the passive surface of the semiconductor die and each of the dissipation leads of the heatsink is connected to a corresponding thermally conductive via of the substrate; and the encapsulation layer is configured to cover the heat dissipation leads of the heat sink and expose the heat dissipation fins of the heat sink.

In accordance with one aspect of the present disclosure, a method for fabricating a semiconductor package is provided. The method comprises flipping and attaching the semiconductor die on the substrate such that the active surface is facing the substrate; mounting the heat sink on the semiconductor die such that such that the second base surface of the heatsink is attached and thermally coupled to the passive surface of the semiconductor die and each of the dissipation leads of the heatsink is connected to a corresponding thermally conductive via of the substrate; forming an electrically insulative encapsulation layer on the substrate to encapsulate the semiconductor die such that the encapsulation layer is configured to cover the heat dissipation leads of the heat sink and expose the heat dissipation fins of the heat sink.

BRIEF DESCRIPTION OF THE DRAWINGS

Preferred embodiments of the present disclosure are described in more detail hereinafter with reference to the drawings, in which.

Figure 1:
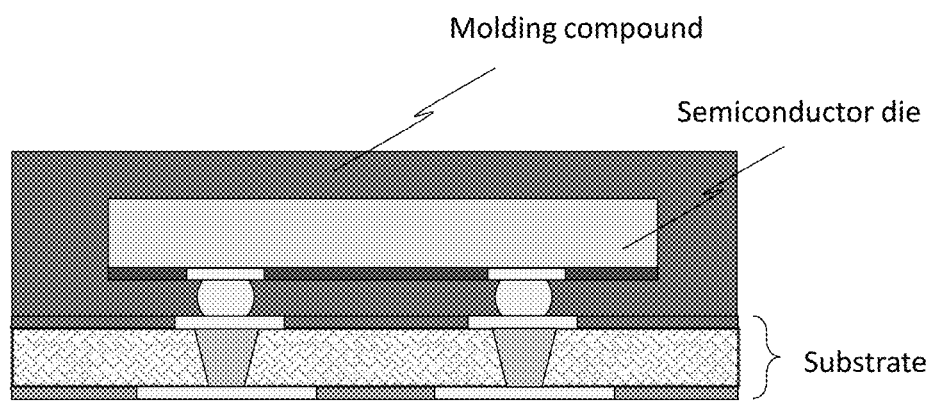
FIG. 1 is a cross-sectional view of a comparative embodiment of flip chip land grid array (FC-LGA) semiconductor package according to some embodiments of the subject application.

It should be noted that various features may not be drawn to scale. In fact, the dimensions of the various features may be arbitrarily increased or reduced for clarity of discussion.

DETAILED DESCRIPTION

Preferred embodiments of the present disclosure will be readily understood from the following detailed description taken in conjunction with the accompanying drawings. Common reference numerals are used throughout the drawings and the detailed description to indicate the same or similar components.

Spatial descriptions, such as "above," "below," "up," "left," "right," "down," "first," "second," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

In the following description, semiconductor packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a cross-sectional view of a comparative embodiment of flip chip land grid array (FC-LGA) semiconductor package in accordance with the subject application. As shown in FIG. 1, a semiconductor die is flipped and attached on a substrate. Electrical terminals of the semiconductor die are electrically connected to bond pads on the first surface of the substrate through a plurality of solder bumps. The semiconductor die is then encapsulated with a molding compound. The packaged semiconductor device may be connected to lands on a mounting board (not shown) by the use of a socket or direct soldering.

Since the FC-LGA semiconductor package does not need to use a space-consuming wire bonding, its overall height can be greatly reduced, for example, to less than 500 µm. However, for proper operation of some high-power devices, a heatsink is needed to carry heat away from the semiconductor device to the ambient. In a typical design, the heatsink is a relatively large piece having a large pre-formed surface area to provide effective heat dissipation by radiation and convection. For some high-power devices, the heatsink may have a total thickness in the range of 5 to 10 mm, which is much larger than the semiconductor package itself and appreciably increase effective size of the overall packaging.

In one aspect of the present invention, a FC-LGA package based on an improved heatsink structure is provided. The heatsink structure design enables inherently continuous and intimate thermal contact between the heatsink and other parts of the FC-LGA package (such as the semiconductor die and the substrate) so as to maintain desirable dissipation capability of a FC-LGA package for high power devices while providing a lower overall packaging profile (including the heatsink) down to a range of 1 to 2 mm.

In another aspect of the present invention, it is provided with a method for manufacturing a FC-LGA package based on the improved heatsink structure to achieve desirable dissipation capability and low package profile.

Figure 2:
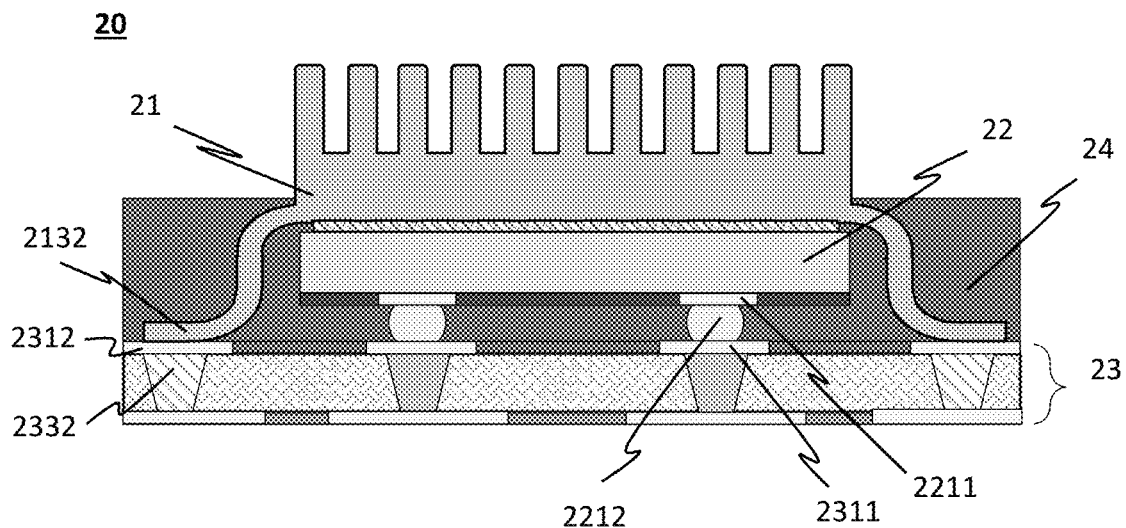
FIG. 2 is a cross-sectional view of a semiconductor device package according to some embodiments of the subject application.

FIG. 2 is a cross-sectional view of a semiconductor device package 20 according to some embodiments of the subject application. The package 20 may comprise: a heatsink 21, a semiconductor die 22, a substrate 23, and encapsulation layer 24. The semiconductor die 22 may be a gallium nitride (GaN) based semiconductor device.

Figure 3:
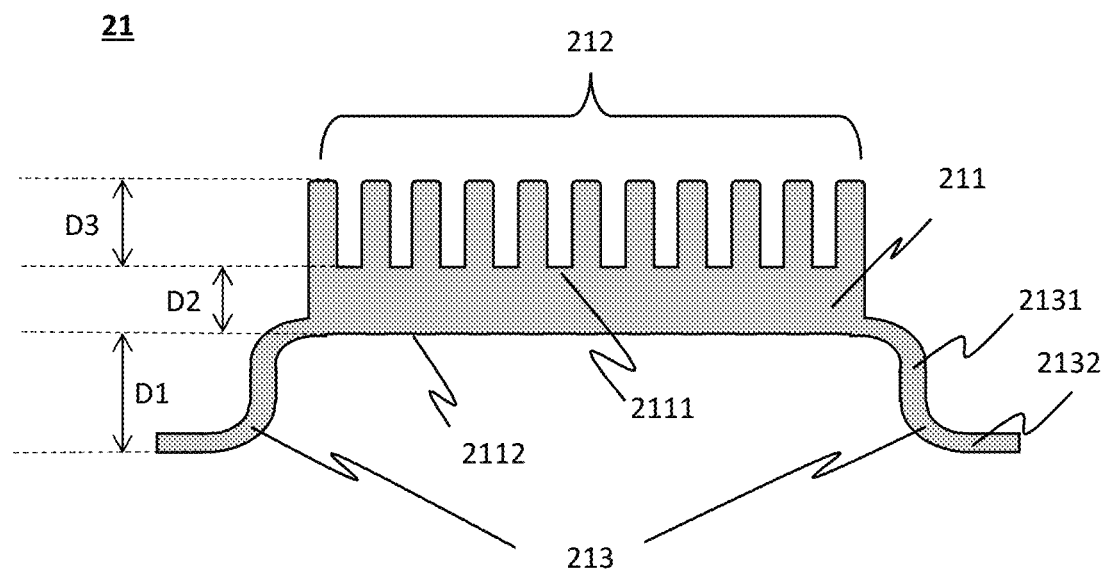
FIG. 3 depicts a cross-sectional view of a heatsink according to some embodiments of the subject application.

FIG. 3 depicts a cross-sectional view of a heatsink 21 according to some embodiments of the subject application. As shown in FIG. 3, the heatsink 21 may comprise a base 211 having a first base surface 2111 and a second base surface 2112 opposite to the first base surface 2111; and a plurality of heat dissipation fins 212 upstanding on the first base surface 2111.

Preferably, the heatsink base 211 has a rectangular shape and a size similar to the semiconductor die 22 so as to achieve a chip-sized package.

The heatsink 21 may further comprise a plurality of heat dissipation leads 213 connecting to the base 211 of the heatsink 21 so as to provide thermal conductivity path from the heatsink 21 to the substrate 23 as well as to support the heatsink 21 to relieve compressive stress applied to the semiconductor die 22 by the heatsink 21 when the heatsink 21 is mounted on the semiconductor die 22.

Each of the heat dissipation leads 213 may have a first lead portion extending and bending downwardly from the base 211 of the heatsink 21 to form a vertically standing portion 2131 to support the heatsink base 211. Each of the heat dissipation leads 213 may further have a second lead portion bending and extending outwardly from the first lead portion to form a horizontally landing portion 2132.

Each of the heat dissipation leads 213 has a lead height D1 measured from the second base surface 2112 to the horizontally landing portion 2132. Preferably, the lead height D1 may be designed to be a sum of thickness of the semiconductor die 22 and thickness of solder bumps 2212 between the semiconductor die 22 and the substrate 23.

The base 211 of the heatsink 21 has a base thickness D2 measured from the first base surface 2111 to the second base surface 2112. Each of the fins 212 has a fin height D3 measured from the first base surface 2111 to an end of the fin.

In some embodiments, the ratio of the lead height D1 to the base thickness D2 may be in a range from approximately 1 to approximately 2. In some embodiments, the ratio of D1 to D2 may be approximately equal to 1.5.

In some embodiments, the ratio of the lead height D1 to the fin height D3 may be in a range from approximately 0.5 to approximately 1.5. In some embodiments, the ratio of D1 to D3 may be approximately equal to 1.

The heatsink 21 may further comprise a coating layer (not shown) configured to be an etching-resistant layer for protecting the heatsink 21. The coating layer may be, for example but no limited to, an electroless nickel plating covered with a thin layer of palladium or gold. In some embodiments, the coating layer may be configured to cover the entire heatsink 21. In some embodiments, the coating layer may be configured to cover the heat dissipation fins 212 and the first base surface 2111 of the heatsink 21.

The heatsink 21 may be formed as a unitary piece by die-casting or molding of a thermally conductive material. The thermally conductive material may be, for example but not limited to, copper, aluminum, or a composite compound consisted of a thermoplastic or epoxy material filled with metal particles.

Figure 4:
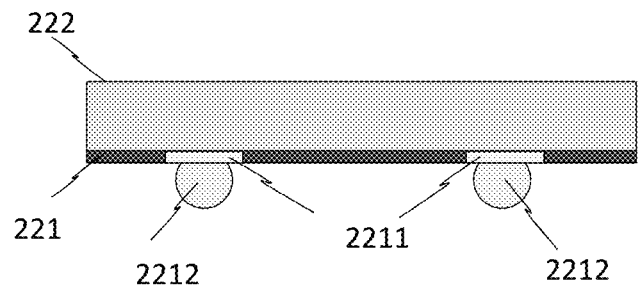
FIG. 4 is a cross-section view of a semiconductor die according to some embodiments of the subject application.

FIG. 4 is a cross-section view of the semiconductor die 22 according to some embodiments of the subject application. The semiconductor die 22 may comprise an active surface 221 having a plurality of die bond pads 2211. The semiconductor die 22 may further comprise a passive surface 222 opposite to the active surface 221.

The die bond pads 2211 may be made of electrically conductive materials including, for example but not be limited to, copper or any other suitable electrically conductive materials.

The semiconductor die 22 may further comprise a plurality of solder bumps 2212 and under bump metallization (UBM) layer (not shown) respectively positioned on the die bond pads 2211. The UMB layer is configured for providing adhesion as well as acting as a solder wetting layer and soldering diffusion barrier.

Figure 5:
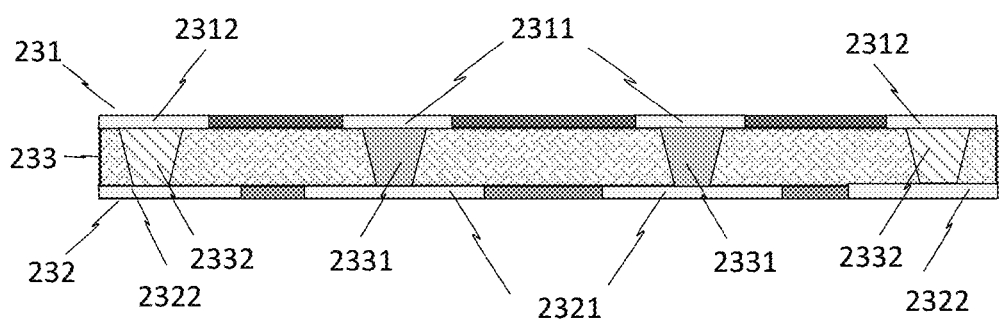
FIG. 5 is a cross-section view of a substrate according to some embodiments of the subject application.

FIG. 5 is a cross-section view of the substrate 23 according to some embodiments of the subject application. The substrate 23 may comprise a first substrate surface 231, a second substrate surface 232 opposite to the first substrate surface 231 and an insulative core layer 233 arranged between the first and second substrate surfaces.

The exemplary materials of the core layer 233 may include, for example but are not limited to, flame retardant woven glass reinforced epoxy (FR4) resin laminate, bismaleimide triazine (BT) resin laminate or other suitable substrate materials.

The substrate 23 may comprise signal wiring traces (not shown) and a plurality of first electrically conductive pads 2311 arranged on the first substrate surface 231. The substrate 23 may further comprise signal wiring traces (not shown) and a plurality of second electrically conductive pads 2321 arranged on the second substrate surface 232. The first and second electrically conductive pads may be made of materials include, for example but not limited to, copper or any other suitable electrically conductive materials.

Each of the first and second electrically conductive pads 2311 and 2321 may be provided with a top-surface metallurgy (TSM) layer (not shown) and a solder bump (not shown) on top of the TSM. The TSM is configured to act as a solder wetting layer and soldering diffusion barrier.

The first substrate surface 231 may further comprise a first protective layer having openings positioned over the first electrically conductive pads 2311. The second substrate surface 232 may further comprise a second protective layer having openings positioned over the second electrically conductive pads 2321. The first and second protective layers may be configured to act as a solder mask (or solder resist) to protect the signal wiring traces on the substrate surfaces and prevent solder bridges across the signal wiring traces.

The substrate 23 may further comprise a plurality of electrical routing vias 2331, each extending through the core layer 233 from the first substrate surface 231 to the second substrate surface 232 and electrically connecting a corresponding first electrically conductive pad 2311 to a corresponding second electrically conductive pad 2321.

The electrical routing vias 2331 may have interior sidewalls being deposited with metallic thin films by electrolytic plating or electroless plating. The exemplary materials of the metallic thin films may include, for example but not limited to, copper, or any other suitable electrically conductive materials.

In some embodiments, the electrical routing vias 2331 may be further filled with electrically conductive fillers. The exemplary materials of the metal thin films may include, for example but not limited to, copper, or any other suitable electrically conductive materials.

Preferably, the substrate 23 may further comprise a plurality of first thermally conductive pads 2312 arranged on the first substrate surface 231. The substrate 23 may further comprise a plurality of second thermally conductive pads 2322 arranged on the second substrate surface 232. The first and second thermally conductive pads may be made of materials include, for example but not be limited to, copper or any other suitable electrically conductive materials.

The substrate 23 may comprise a plurality of thermal dissipation vias 2332, each extending from the first substrate surface 231 to the second substrate surface 232 and thermally connecting a corresponding first thermally conductive pad 2312 to a corresponding second thermally conductive pad 2322.

The thermal dissipation vias 2332 may be filled with thermally conductive fillers. The exemplary materials of the metal thin films may include, for example but not limited to, copper, or any other suitable electrically conductive materials.

The first protective layer may be further configured to have openings positioned over the first thermally conductive pads 2312. The second protective layer may be further configured to have openings positioned over the second thermally conductive pads 2322.

Referring back to FIG. 2, the semiconductor die 22 may be flipped and attached on the substrate 23 such that the active surface 221 is facing the first substrate surface 231 and each of the die bond pads 2211 being electrically connected to a corresponding first electrically conductive pads 2311 of the substrate 23 through a corresponding solder bump 2212.

The horizontally landing portion 2132 of the heatsink 21 may be configured for being fixed on a corresponding first thermally conductive pad 2312 positioned on the substrate 23 and connected to a corresponding thermally conductive via 2332. In some embodiments, each landing portion 2132 may be fixed on the corresponding first thermally conductive pad 2312 by soldering.

FIGS. 6A-6G and 7A-7G depicts top views of heatsinks with various configuration of heat dissipation fins and heat dissipation leads according to some embodiments of the subject application.

Figure 6A:
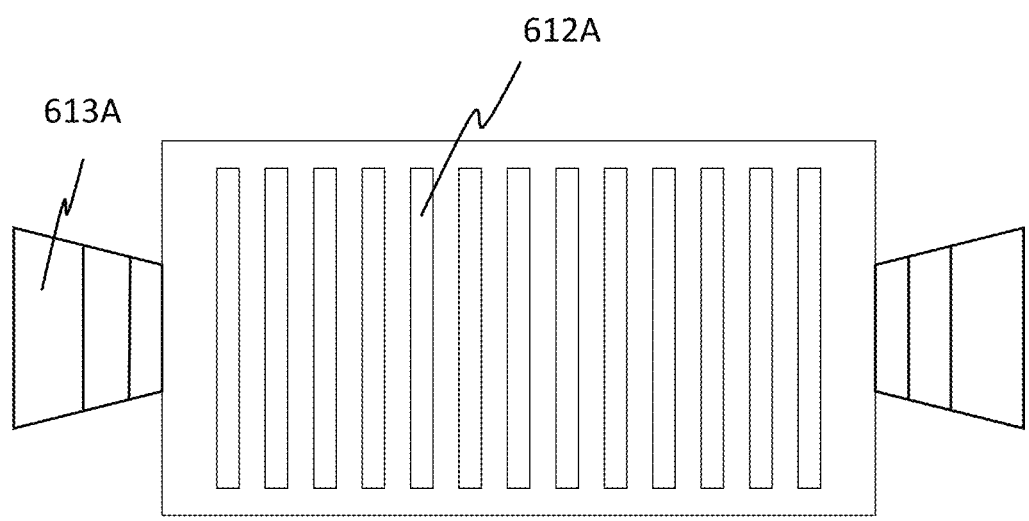
FIGS. 6A-6G depicts various configuration of heat dissipation fins and heat dissipation leads according to some embodiments of the subject application.
Figure 6B:
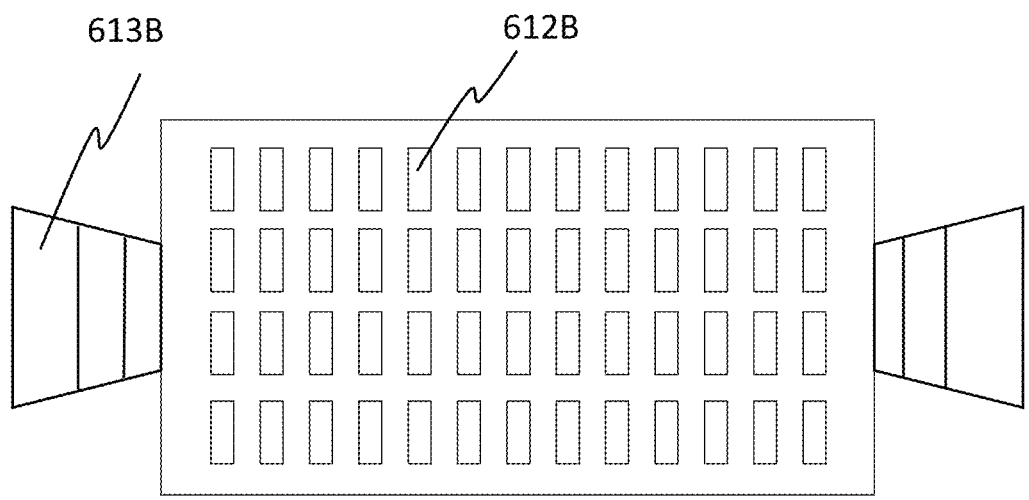
Figure 6C:
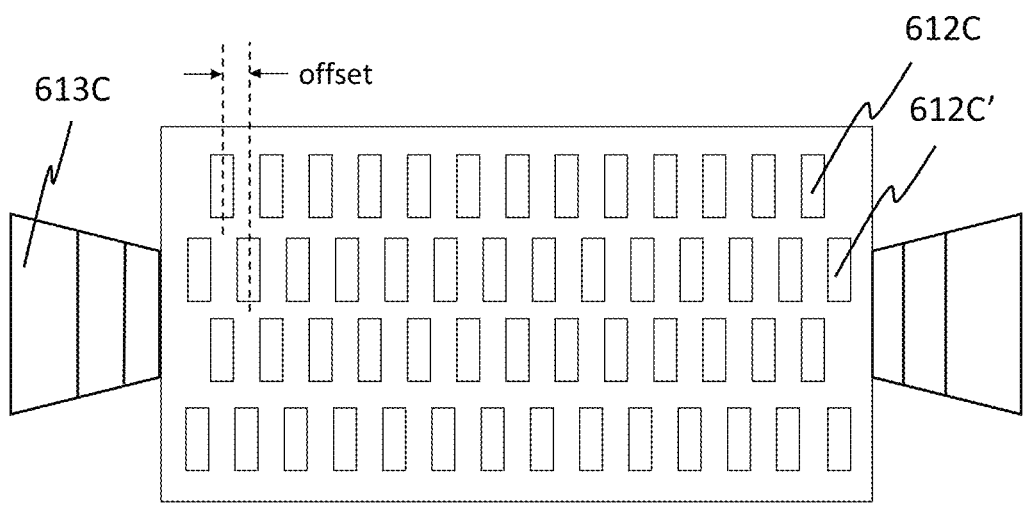

Referring to FIGS. 6A-6C (or 7A-7C). The heat dissipation fins may be a plurality of plate fins. As shown in FIG. 6A, the plate fins 612A (or 712A) may be arranged to be running in parallel across the entire length of the base of the heatsink. As shown in FIGS. 6B and 6C (or 7B and 7C), the heat dissipation fins may be a plurality of separated plate fins. The separated plate fins may be grouped to form a plurality of one-dimensional arrays of fins. As shown in FIG. 6B (or 7B), each array of fins 612B (or 712B) may be aligned with each other to form a normal grid pattern. As shown in FIG. 6C (7C), each array of fins 612C (or 712C) may have a slight offset from an adjacent array of fins 612C' (or 612C') to form an offset grid pattern.

Figure 6D:
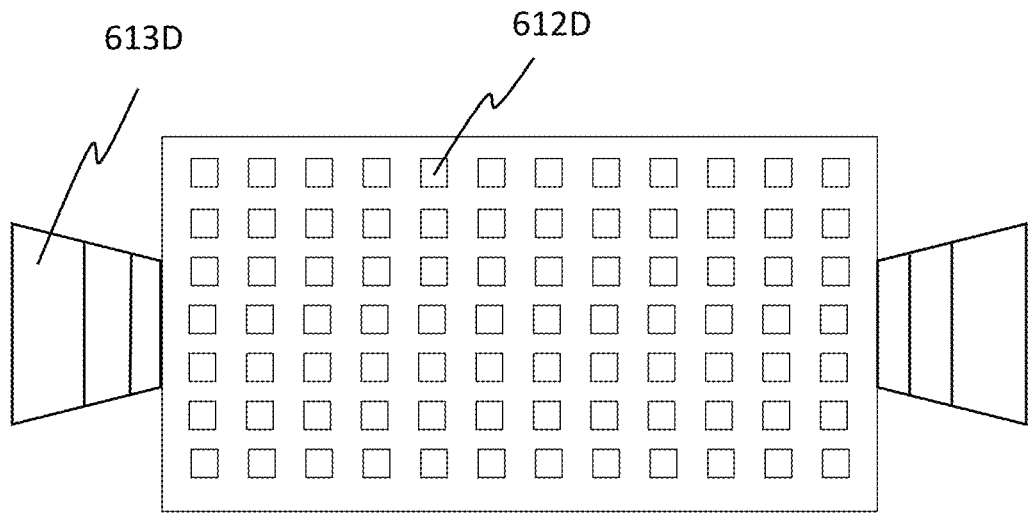
Figure 6E:
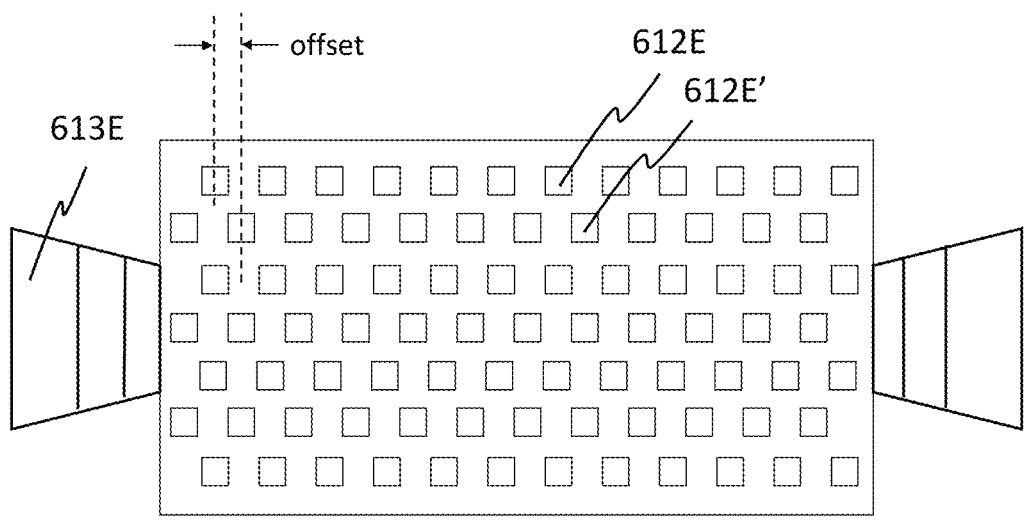

Referring to FIGS. 6D-6E (or 7D-7E). The heat dissipation fins may be a plurality of pin fins. The pin fins may be grouped to form a plurality of one-dimensional arrays. As shown in FIG. 6D (or 7D), each array of pin fins 612D may be aligned with one and other to form a normal grid pattern. As shown in FIG. 6E (or 7E), each array of pin fins 612E (or 712E) may have a slight offset from an adjacent array of fins 612E' (or 712E') to form an offset grid pattern.

Figure 6F:
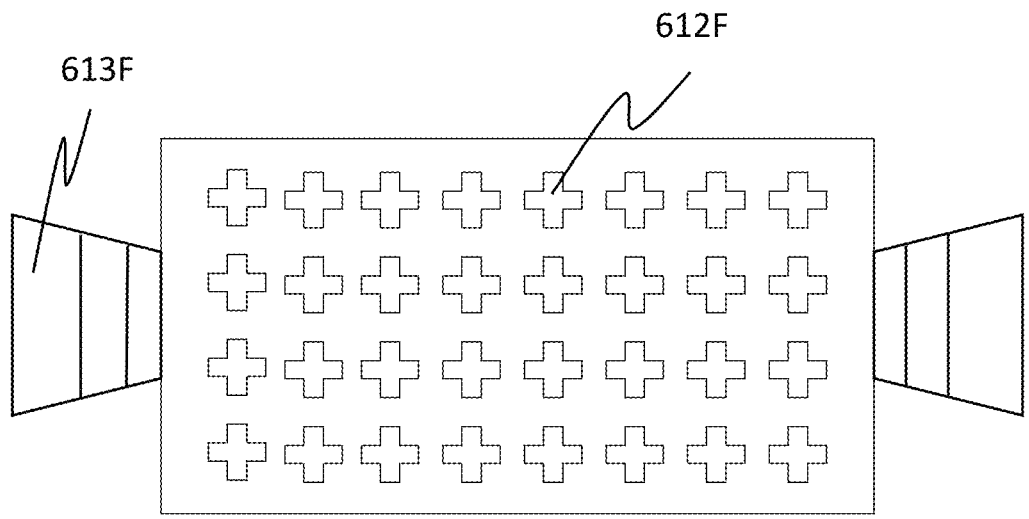
Figure 6G:
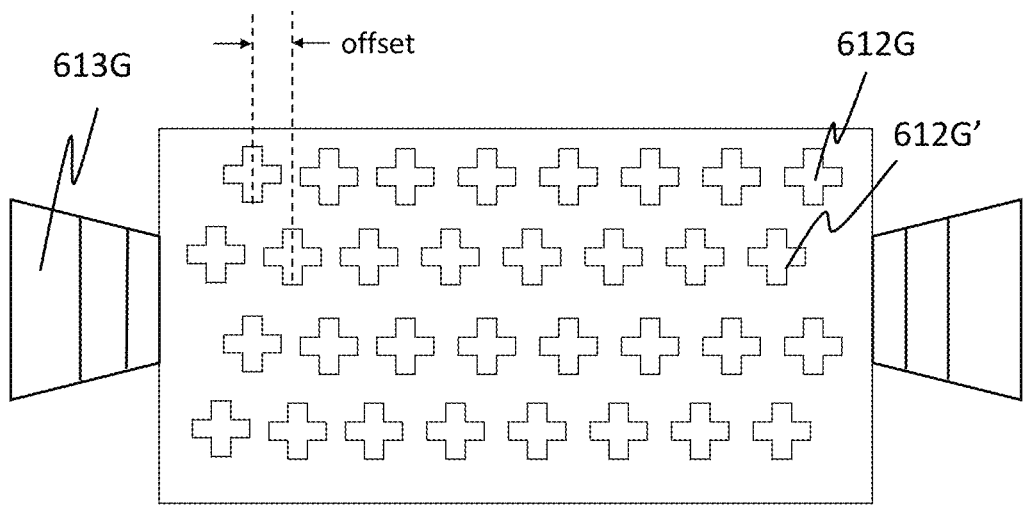
Figure 7A:
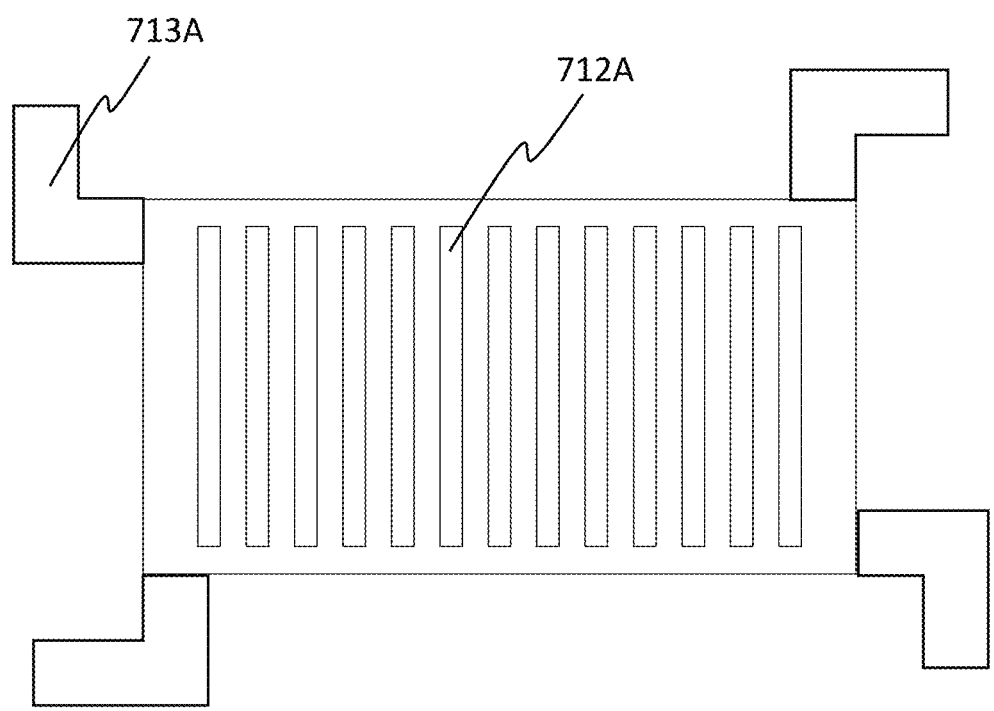
FIGS. 7A-7G depicts various configuration of heat dissipation fins and heat dissipation leads according to other embodiments of the subject application.
Figure 7B:
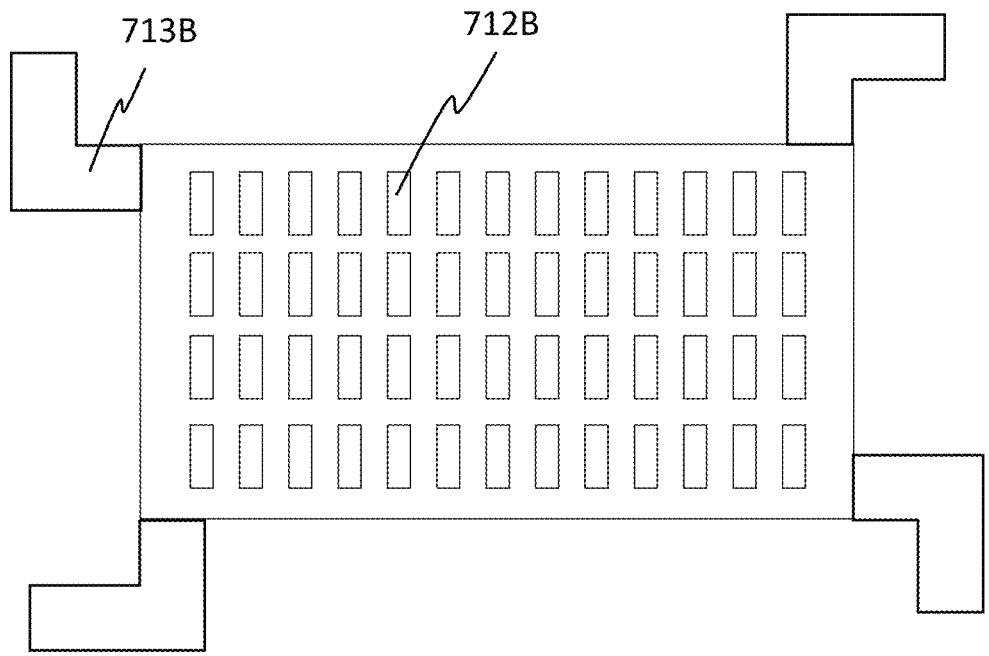
Figure 7C:
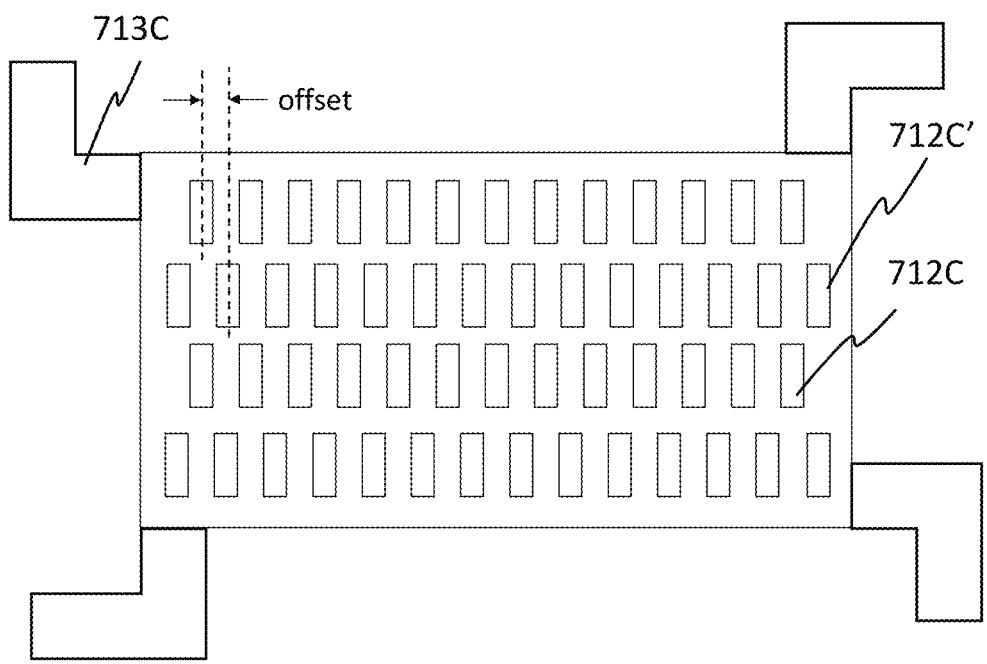
Figure 7D:
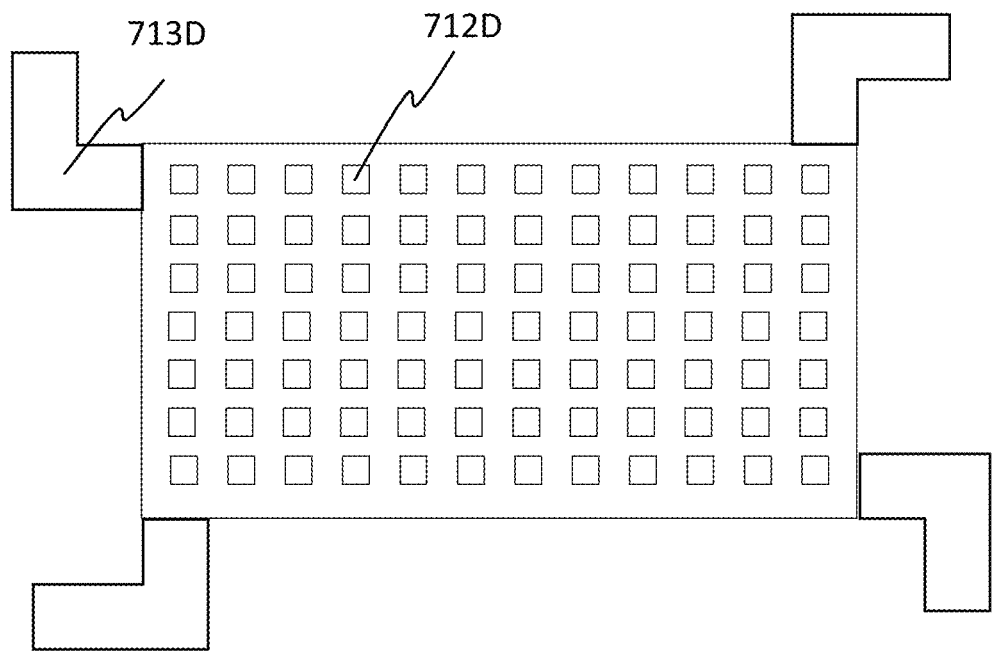
Figure 7E:
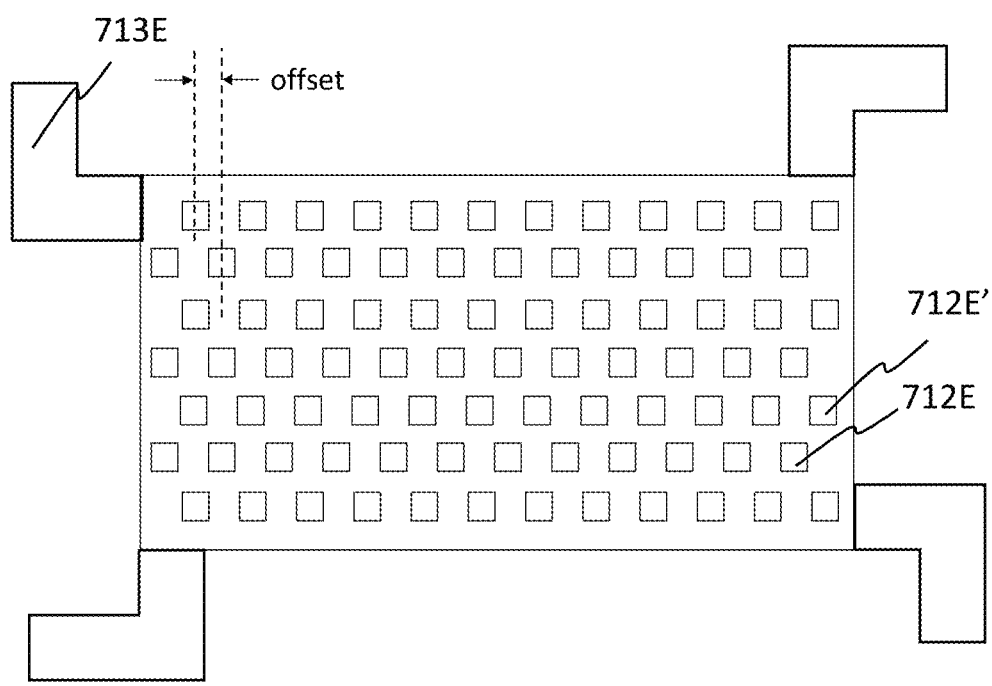
Figure 7F:
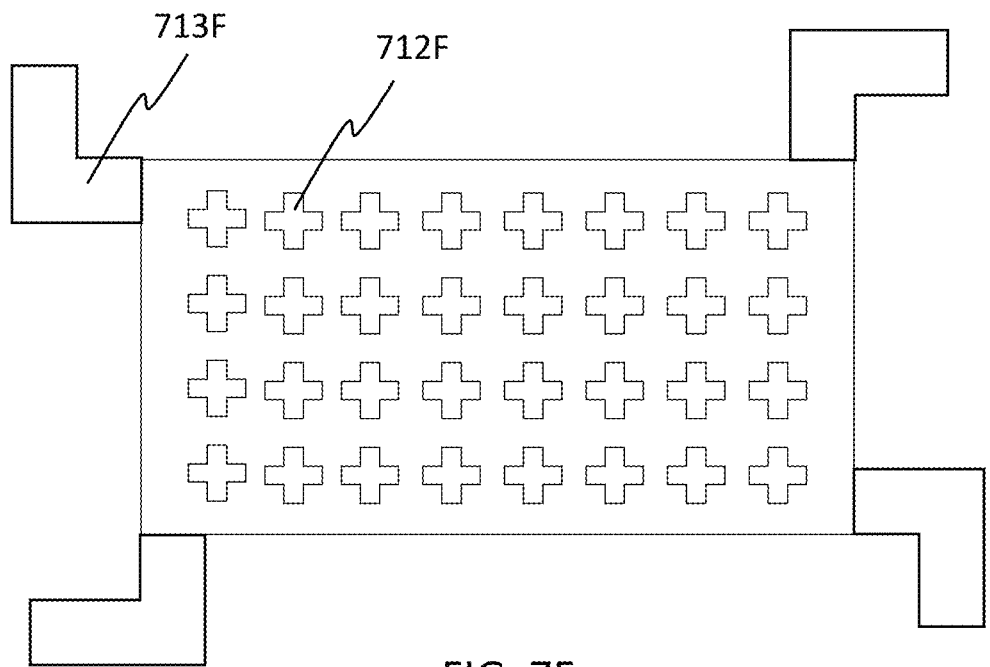
Figure 7G:
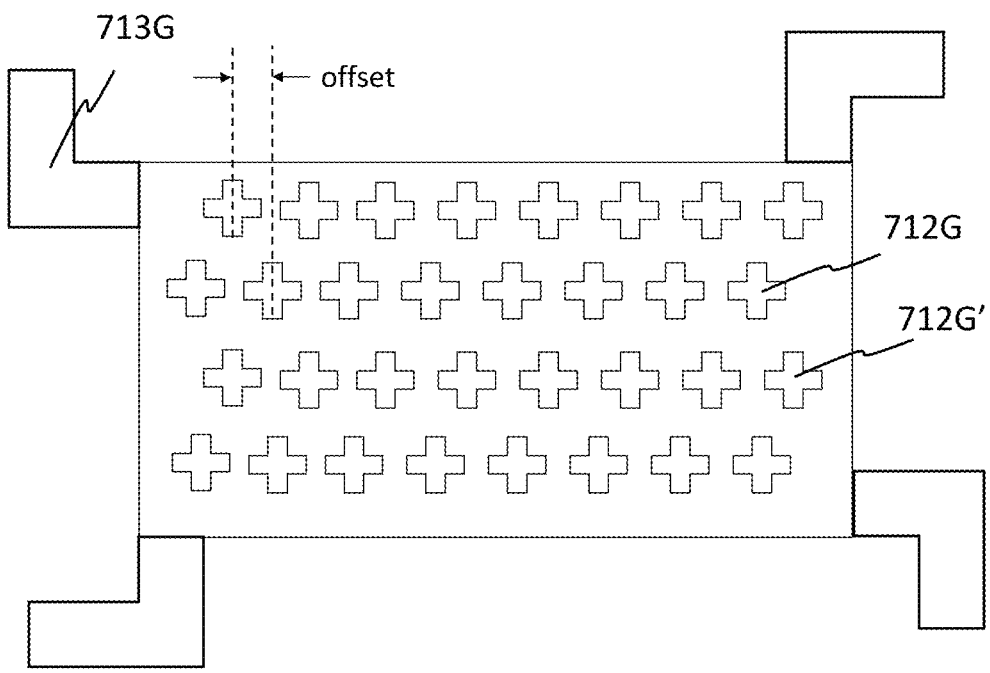

Referring to FIG. 6F-6G (or 7F-7G). The heat dissipation fins may be a plurality of cross-shaped fins. The cross-shaped fins may be grouped to form a plurality of one-dimensional arrays. As shown in FIG. 6F (or 7F), each array of cross-shaped fins 612F (or 712F) may be aligned with each other to form a normal grid pattern. As shown in FIG. 6G (or 7G), each array of cross-shaped fins 612G (or 712G) may have a slight offset from an adjacent array of fins 612G' (or 712G') to form an offset grid pattern.

In some embodiments, the heatsink may comprise four heat dissipation leads 613A-613G each extending from a corresponding corner of the base of the heatsink as shown in FIGS. 6A-6G respectively. In some embodiments, the heatsink may further comprise two heat dissipation leads 713A-713G extending from a pair of opposite sides of the base of the heatsink respectively as shown in FIGS. 7A-7G respectively.

Figure 8A:
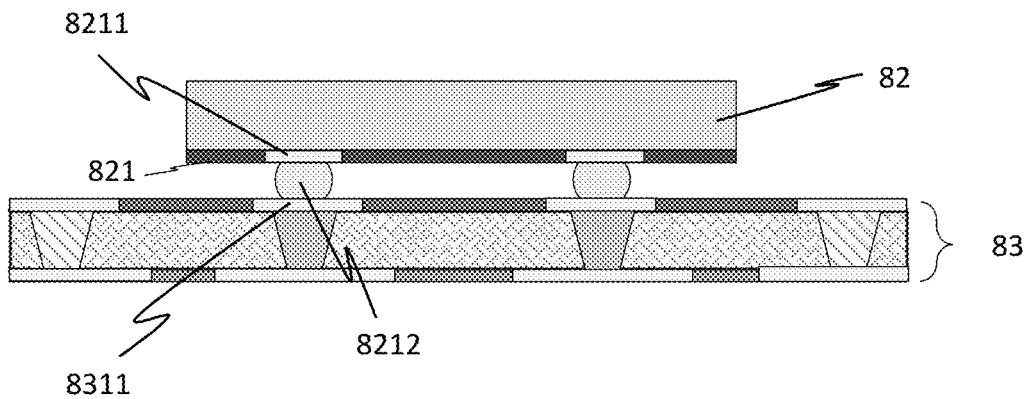
FIGS. 8A-8C depict steps of a method for manufacturing a flip chip semiconductor device package according to some embodiments of the subject application.
Figure 8B:
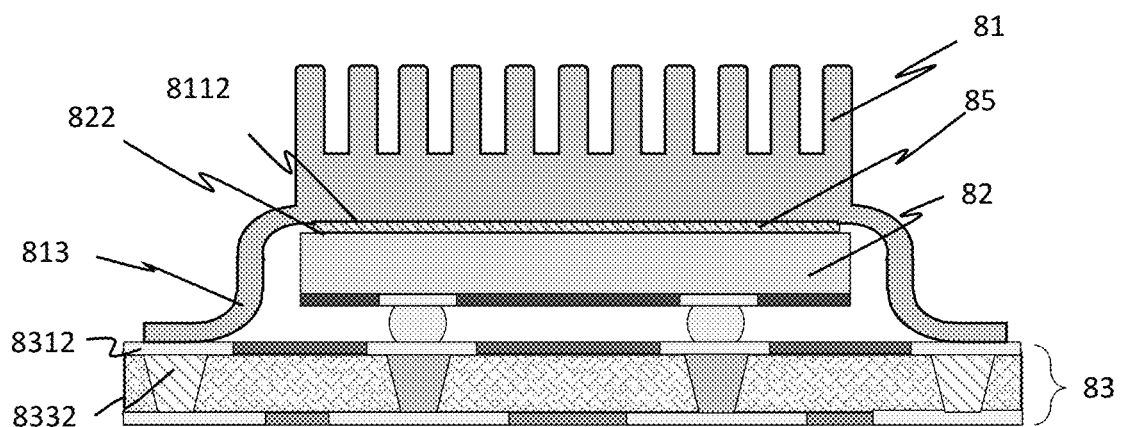
Figure 8C:
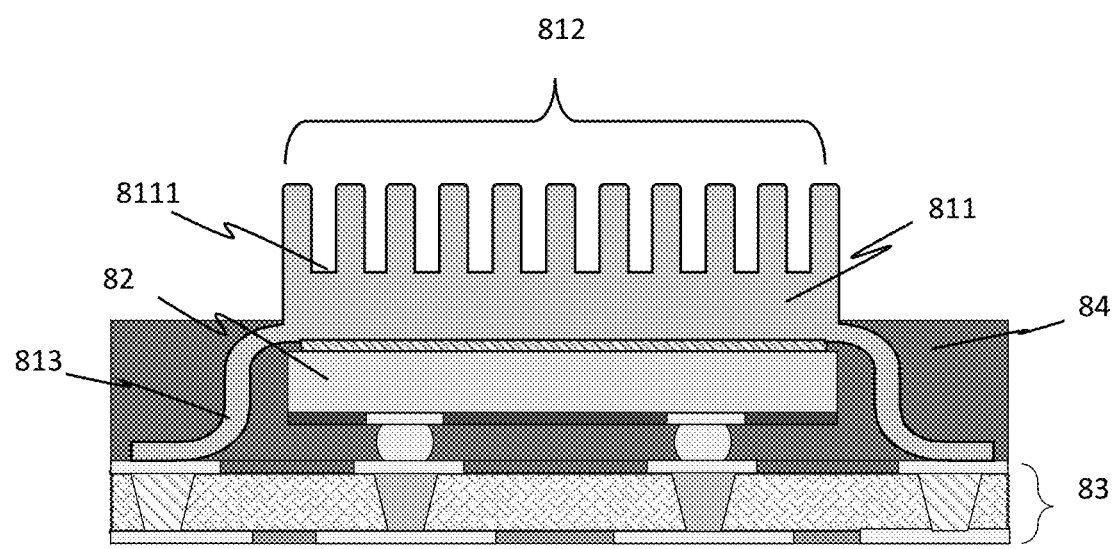

FIGS. 8A-8C depict steps of a method for manufacturing a flip chip semiconductor device package according to some embodiments of the subject application.

In the step illustrated in FIG. 8A, a semiconductor die 82 is attached on a substrate 83 such that an active surface 821 of the semiconductor die 82 is facing the substrate 83 and each of a plurality of die bond pads 8211 of the semiconductor die 82 is electrically connected to a corresponding first electrically conductive pad 8311 of the substrate 83.

In some embodiments, the die bond pads 8211 of the semiconductor die 82 may be connected to the corresponding first electrically conductive pads by reflowing of solder bumps 8212 deposited on the semiconductor die 82 after the semiconductor die 82 is placed on the substrate 83.

In the step as illustrated in FIG. 8B, a heatsink 81 is mounted on the semiconductor die 82 such that a second base surface 8112 of the heatsink 81 is attached and thermally coupled to a passive surface 822 of the semiconductor die 82 and each of a plurality of dissipation leads 813 of the heatsink 81 is connected to a corresponding thermally conductive via 8332 of the substrate 83.

In some embodiments, the second base surface 8112 of the heatsink 21 may be adhered to the passive surface 222 of the semiconductor die through a thermally conductive adhesive 85. The thermally conductive adhesive 85 may include, but not be limited to, an epoxy filled with metallic fillers.

In some embodiments, each of the dissipation leads 813 of the heatsink 81 may be bonded to the corresponding first thermally conductive pad 8312 on the substrate 83 by soldering or applying a thermally conductive adhesive. The thermally conductive adhesive may include, but not be limited to, an epoxy filled with metallic fillers.

In the step as illustrated in FIG. 8C, an encapsulation layer 84 and configured to cover the dissipation leads 813 of the heatsink 81 and expose the base 811 and the fins 812 of the heatsink 81.

In some embodiments, the encapsulation layer 84 is formed by dispensing an underfill resin with a predefined volume to encapsulate the semiconductor die 82 and the dissipation leads 813. The underfill resin may be, for example but not limited to, an ultra-violet curable epoxy.

In some embodiments, a protective coating layer is deposited to cover the heat dissipation fins 812 and the first base surface 8111 of the heatsink 81 after the heat sink 81 is mounted on the semiconductor die 82. The formation of the encapsulation layer 84 may include steps as illustrated in FIG. 9A-9C.

Figure 9A:
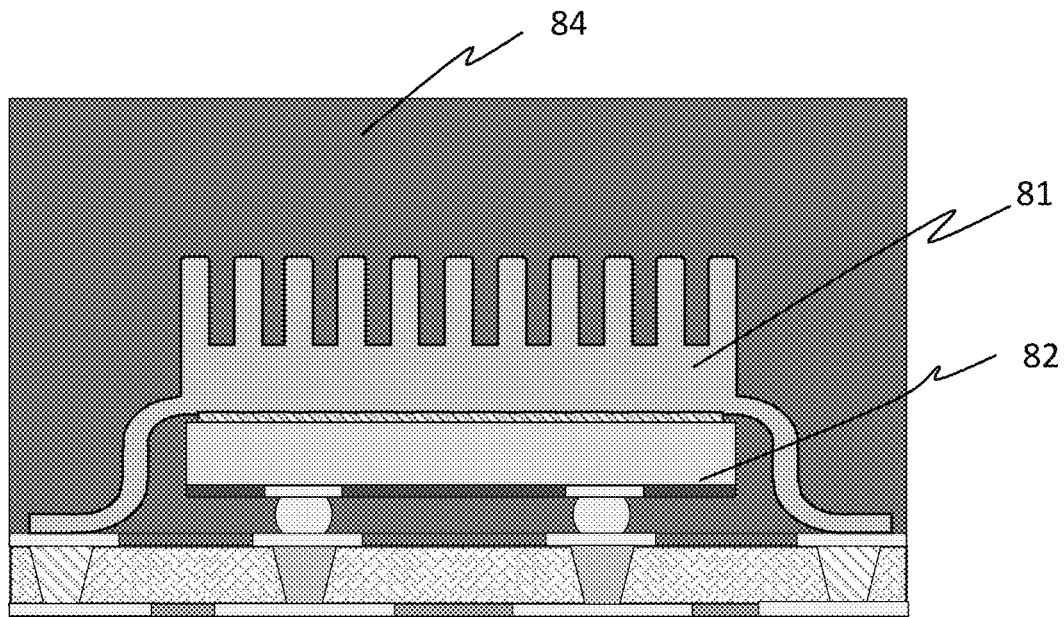
FIGS. 9A-9C depict steps of the formation of an encapsulation layer in a flip chip semiconductor device package according to some embodiments of the subject application.

In the step illustrated in FIG. 9A, both of the semiconductor die 82 and the heatsink 81 are encapsulated completely with the encapsulation layer 84.

Figure 9B:
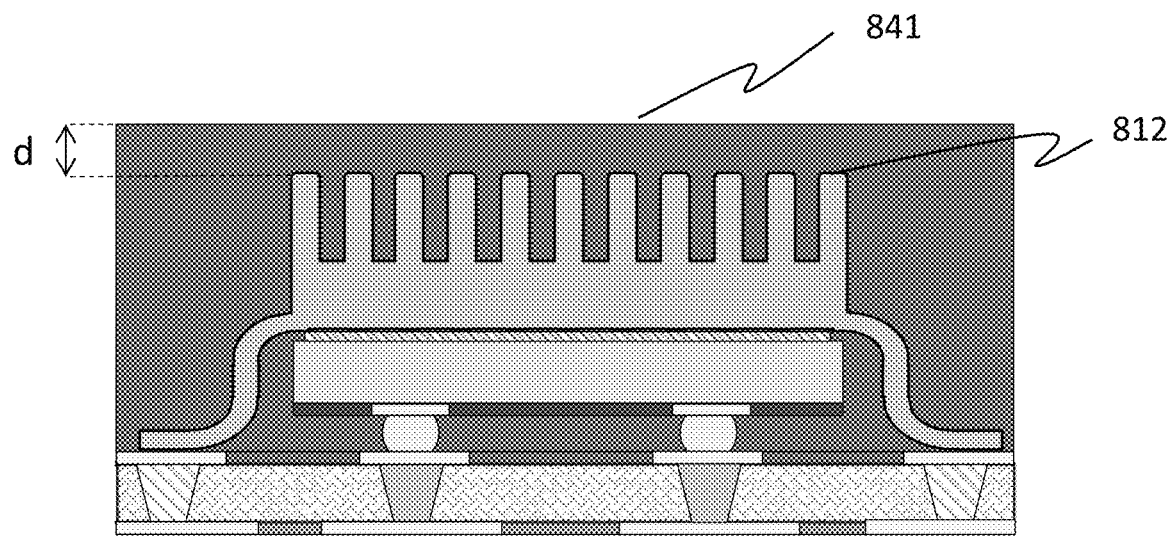

In the step illustrated in FIG. 9B, a top side 841 of the encapsulation layer 84 is polished until the top side 841 is above the heat dissipation fins 812 for a distance d. In some embodiments, the distance d may range from approximately 1 μm to approximately 10 μm.

Figure 9C:
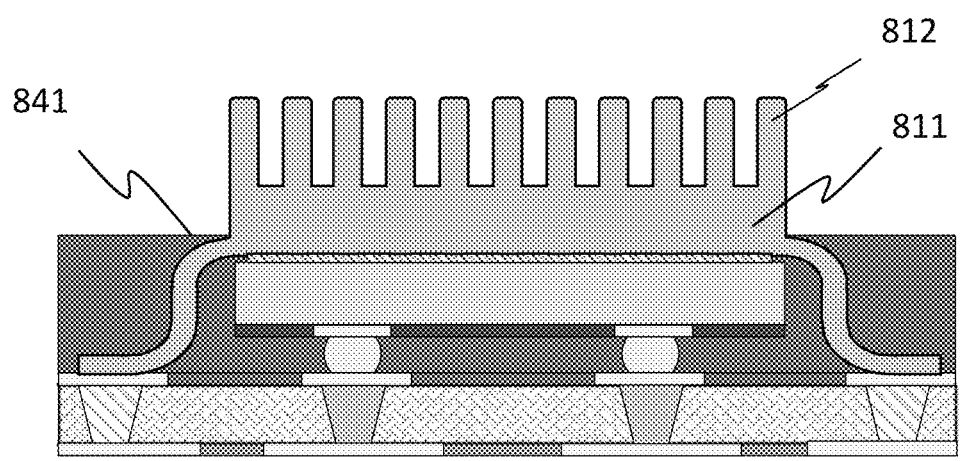

In the step illustrated in FIG. 9C, the top side 841 of the encapsulation layer is etched until the heatsink base 811 and the heat dissipation fins 812 are exposed. In some embodiments, the top side of the encapsulation layer 84 may be etched with an etching solution made of $HNO_3$ and $H_2SO_4$ in a ratio of approximately 5:2.

In some embodiments, the flip chip semiconductor package may be, for example but not limited to, a land grid array (LGA) package, a ball grid array (BGA) package, or a pin grid array (PGA) package.

In some embodiments, the semiconductor die may be a device based on high electron mobility transistor (HEMT) or a metal oxide semiconductor field effect transistor (MOSFET). The structure of the transistor may be selected from N-channel enhancement type, N-channel depletion type, P-channel enhancement type, or P-channel depletion type. The transistor may be formed of or include an III-V compound, which includes, but not limited to, for example, GaN, GaAs, InP, InGaAs and AlGaAs.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims.

The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto.

While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor package, comprising:
   a substrate having a first substrate surface, a second substrate surface opposite to the first substrate surface; an insulative core layer arranged between the first and second substrate surfaces and a plurality of thermally conductive vias extending from the first substrate surface to the second substrate surface through the core layer;
   a semiconductor die having an active surface and a passive surface opposite to the active surface; and being flipped and attached on the substrate such that the active surface is facing the substrate;
a heat sink having a base comprising a first base surface and a second base surface opposite to the first base surface; a plurality of heat dissipation fins upstanding on the first base surface; and a plurality of heat dissipation leads connecting to the base; wherein the second base surface is spaced from the substrate;
an encapsulation layer formed on the substrate and configured for encapsulating the semiconductor die;
wherein:
the heatsink is mounted on the semiconductor chip such that the second base surface of the heatsink is attached and thermally coupled to the passive surface of the semiconductor die and each of the dissipation leads of the heatsink is connected to a corresponding thermally conductive pad covering a corresponding thermally conductive via of the substrate; and
the encapsulation layer is configured to cover the heat dissipation leads of the heat sink and expose the heat dissipation fins of the heat sink.

2. The semiconductor package according to claim 1, wherein each of the heat dissipation leads has a first lead portion extending and bending downwardly from the base of the heatsink to form a vertically standing portion to support the heatsink base; and a second lead portion bending and extending outwardly from the first lead portion to form a horizontally landing portion configured for being fixed on the corresponding thermally conductive pad covering the corresponding thermally conductive via of the substrate.

3. The semiconductor package according to claim 1, wherein the base of the heatsink has a rectangular shape; and the heatsink comprises four heat dissipation leads, each extending from a corresponding corner of the base of the heatsink.

4. The semiconductor package according to claim 1, wherein the base of the heatsink has a rectangular shape; and the heatsink comprises two heat dissipation leads extending from a pair of opposite sides of the base of the heatsink respectively.

5. The semiconductor package according to claim 1, wherein the heat dissipation fins are a plurality of plate fins arranged to be running in parallel across an entire length of the base of the heatsink.

6. The semiconductor package according to claim 1, wherein the heat dissipation fins are a plurality of separated plate fins grouped to form a plurality of one-dimensional arrays of separated plate fins.

7. The semiconductor package according to claim 6, wherein each array of the separated plate fins is aligned with each other to form a normal grid pattern.

8. The semiconductor package according to claim 6, wherein each array of the separated plate fins has a slight offset from an adjacent array of fins to form an offset grid pattern.

9. The semiconductor package according to claim 1, wherein the heat dissipation fins are a plurality of pin fins grouped to form a plurality of one-dimensional arrays of pin fins.

10. The semiconductor package according to claim 9, wherein each array of the pin fins is aligned with one and other to form a normal grid pattern.

11. The semiconductor package according to claim 9, wherein each array of the pin fins has a slight offset from an adjacent array of pin fins to form an offset grid pattern.

12. The semiconductor package according to claim 1, wherein the heat dissipation fins are a plurality of cross-shaped fins grouped to form a plurality of one-dimensional arrays.

13. The semiconductor package according to claim 12, wherein each array of the cross-shaped fins is aligned with one and other to form a normal grid pattern.

14. The semiconductor package according to claim 12, wherein each array of the cross-shaped fins has a slight offset from an adjacent array of cross-shaped fins to form an offset grid pattern.

15. The semiconductor package according to claim 1, wherein the heat sink is formed as a unitary piece.

16. The semiconductor package according to claim 1, wherein the heatsink further comprises a protective coating layer covering the heat dissipation fins and the first base surface of the heatsink.

17. A method for fabricating a semiconductor package, comprising:
providing a substrate having a first substrate surface, a second substrate surface opposite to the first substrate surface; an insulative core layer arranged between the first and second substrate surfaces and a plurality of thermally conductive vias extending from the first substrate surface to the second substrate surface through the core layer;
providing a semiconductor die having an active surface and a passive surface opposite to the active surface;
flipping and attaching the semiconductor die on the substrate such that the active surface of the semiconductor die is facing the substrate;
providing a heat sink having a base comprising a first base surface and a second base surface opposite to the first base surface, a plurality of heat dissipation fins upstanding on the first base surface and a plurality of heat dissipation leads connecting to the base; wherein the second base surface is spaced from the substrate;
mounting the heat sink on the semiconductor die such that the second base surface of the heatsink is attached and thermally coupled to the passive surface of the semiconductor die and each of the dissipation leads of the heatsink is connected to a corresponding thermally conductive pad covering a corresponding thermally conductive via of the substrate;
forming an electrically insulative encapsulation layer on the substrate to encapsulate the semiconductor die such that the encapsulation layer is configured to cover the heat dissipation leads of the heat sink and expose the heat dissipation fins of the heat sink.

18. The method according to claim 17, wherein the formation of the encapsulation layer comprising dispending an underfill resin with a predefined volume to encapsulate the semiconductor die and the dissipation leads.

19. The method according to claim 17, wherein the formation of the encapsulation layer comprising:
depositing a protective coating layer to the heat dissipation fins and the first base surface of the heatsink;
encapsulating the semiconductor chip and the heat sink with a molding compound;
polishing a top side of the encapsulation layer until the top side is above the heat dissipation fins for a distance d;
etching the top side of the encapsulation layer until the heat dissipation fins and the first base surface of the heat sink are exposed.

20. The method according to claim 19, wherein the top side of the encapsulation layer is etched with an etching solution made of HNO3 and H2SO4 in a ratio of approximately 5:2.

\* \* \* \* \*